United States Patent
Jian et al.

(10) Patent No.: US 9,686,024 B2
(45) Date of Patent: Jun. 20, 2017

(54) TRUE RADIO FREQUENCY (RF) POWER DETECTOR

(71) Applicant: Avago Technologies General IP (Singapore) Pte. Ltd., Singapore (SG)

(72) Inventors: Heng-Yu Jian, San Diego, CA (US); Chun-Hao Hsu, San Diego, CA (US)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 0 days.

(21) Appl. No.: 14/713,776

(22) Filed: May 15, 2015

(65) Prior Publication Data
US 2016/0315719 A1 Oct. 27, 2016

Related U.S. Application Data

(60) Provisional application No. 62/153,124, filed on Apr. 27, 2015.

(51) Int. Cl.
| | |
|---|---|
| *H03C 1/62* | (2006.01) |
| *H04B 17/13* | (2015.01) |
| *G01R 21/10* | (2006.01) |
| *H04B 1/04* | (2006.01) |
| *H04B 17/12* | (2015.01) |
| *H04B 17/10* | (2015.01) |

(52) U.S. Cl.
CPC ............ *H04B 17/13* (2015.01); *G01R 21/10* (2013.01); *H04B 1/04* (2013.01); *H04B 17/102* (2015.01); *H04B 17/12* (2015.01); *H04B 2001/0408* (2013.01)

(58) Field of Classification Search
CPC .... H04B 1/0466; H04B 1/0475; H04B 17/13; H04B 17/12; H03G 3/3042; H03G 3/3047; H03G 3/3036; G01R 29/06; H03F 1/3247

USPC .......................................................... 455/115.1
See application file for complete search history.

(56) References Cited

U.S. PATENT DOCUMENTS

2009/0153250 A1* 6/2009 Rofougaran .......... H03F 1/0222
330/297

OTHER PUBLICATIONS

Da Mota, et al., "A True Power Detector for RF PA Built-In Calibration and Testing", Design, Automation & Test in Europe Conference & Exhibition, Grenoble, France, (2011), 6 pages.

(Continued)

*Primary Examiner* — Ajibola Akinyemi
(74) *Attorney, Agent, or Firm* — Sterne, Kessler, Goldstein & Fox P.L.L.C.

(57) ABSTRACT

A power detector is described herein that detects a true power provided by power amplifier of an RF transmitter. The power detector may include a plurality of voltage detectors that determine one or more voltages of a power amplifier included in the RF transmitter and/or a transformer included in the RF transmitter. At least one of the voltage detectors may be coupled to a sense inductor that senses one or more magnetic fields emitted by the transformer. The at least one voltage detector coupled to the sense inductor determines the voltage induced across the sense inductor as a result of the sensed magnetic field(s). The determined voltage(s) may be used to determine the load impedance of an antenna of the RF transmitter that transmits the RF signals. The load impedance may be used to accurately measure the power regardless of any impedance mismatches between the power amplifier and the antenna.

20 Claims, 7 Drawing Sheets

(56) References Cited

OTHER PUBLICATIONS

Francois, et al., "A Transformer-Coupled True-RMS Power Detector in 40nm CMOS", International Solid-State Circuits Conference Digest of Technical Papers (ISSCC), IEEE International, San Francisco, CA, (2014), 3 pages.

\* cited by examiner

TRUE RADIO FREQUENCY (RF) POWER DETECTOR

CROSS-REFERENCE TO RELATED APPLICATION(S)

This application claims the benefit of U.S. Provisional Patent Application No. 62/153,124, filed on Apr. 27, 2015, the entirety of which is incorporated by reference herein.

BACKGROUND

Technical Field

The present invention generally relates to systems and methods for power detection.

Description of Related Art

Radio Frequency (RF) power amplifiers are used in communication devices such as cellular telephones, smart phones, personal digital assistants (PDAs), etc. for amplifying an RF signal for transmission by an antenna coupled thereto. In certain cases, the output power provided by the RF power amplifier has to be well-controlled (e.g., due to the specifications of the communication system for which the RF signal is transmitted).

To control the output power, a power detector can be used to determine an amount of power provided by the power amplifier. Conventional power detectors can properly determine the output power only when the antenna has a fixed load impedance. In practice, however, the antenna undergoes load impedance variations (e.g., due to a change in ambient temperatures, deterioration due to age, direct touch of a human body to the antenna, etc.). Such load impedance variations cause impedance mismatches between the RF power amplifier and the antenna, which in turn, cause the output power provided by the RF power amplifier to be reduced. These load impedance variations are not taken into account by conventional power detectors. Thus, conventional power detectors do not accurately determine the true power provided by the RF power amplifier.

BRIEF SUMMARY

Methods, systems, and apparatuses are described for power detection, substantially as shown in and/or described herein in connection with at least one of the figures, as set forth more completely in the claims

BRIEF DESCRIPTION OF THE DRAWINGS/FIGURES

The accompanying drawings, which are incorporated herein and form a part of the specification, illustrate embodiments and, together with the description, further serve to explain the principles of the embodiments and to enable a person skilled in the pertinent art to make and use the embodiments.

Figure 1:
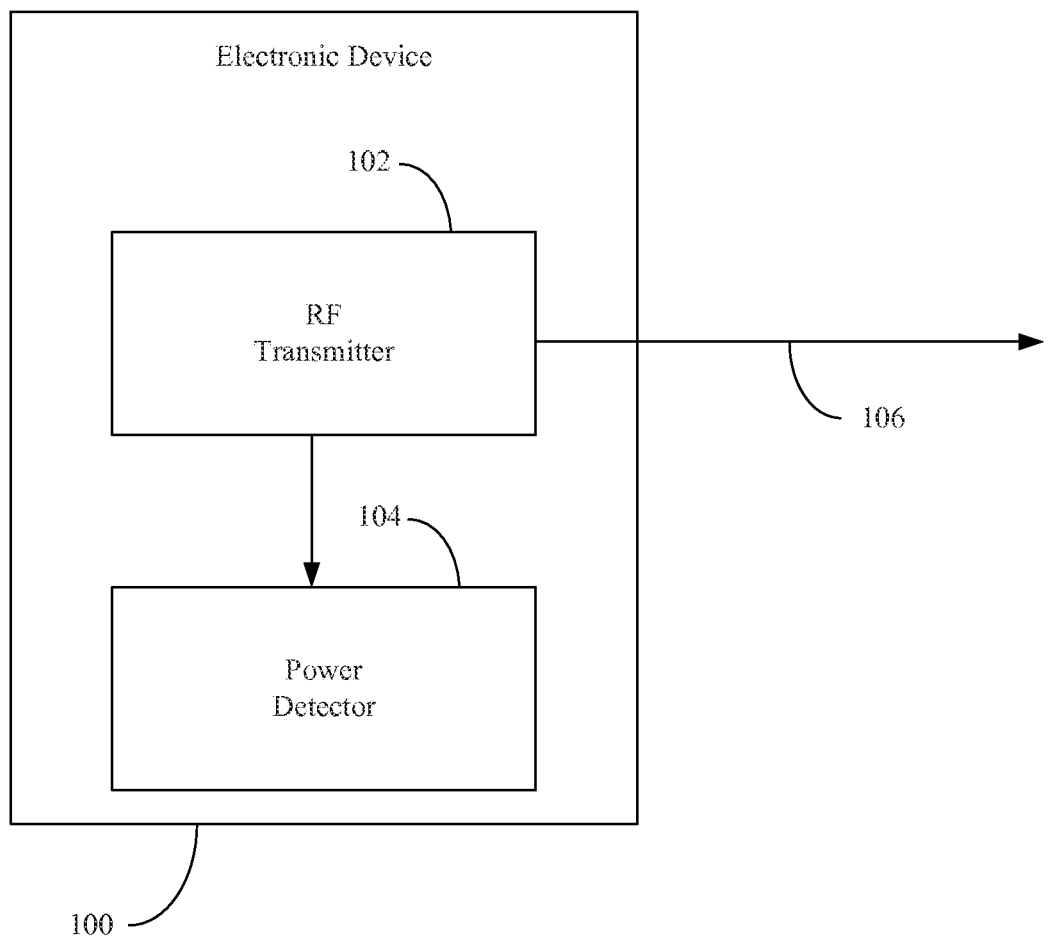
FIG. 1 is a block diagram of an example electronic device that is operable to carry out wireless communication in accordance with an embodiment.

The features and advantages of the subject matter of the present application will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

I. Introduction

The present specification discloses numerous example embodiments. The scope of the present patent application is not limited to the disclosed embodiments, but also encompasses combinations of the disclosed embodiments, as well as modifications to the disclosed embodiments.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Further, descriptive terms used herein such as "about," "approximately," and "substantially" have equivalent meanings and may be used interchangeably.

Still further, the terms "coupled" and "connected" may be used synonymously herein, and may refer to physical, operative, electrical, communicative and/or other connections between components described herein, as would be understood by a person of skill in the relevant art(s) having the benefit of this disclosure.

Numerous exemplary embodiments are now described. Any section/subsection headings provided herein are not intended to be limiting. Embodiments are described throughout this document, and any type of embodiment may be included under any section/subsection. Furthermore, it is contemplated that the disclosed embodiments may be combined with each other in any manner.

II. Example Embodiments

A power detector is described herein that detects a true power provided by a power amplifier of an RF transmitter. The power detector may include a plurality of voltage detectors that determine one or more voltages of a power amplifier included in the RF transmitter and/or a transformer included in the RF transmitter. At least one of the voltage detectors may be coupled to a sense inductor that senses one or more magnetic fields emitted by the transformer. The at least one voltage detector coupled to the sense inductor determines the voltage induced across the sense inductor as a result of the sensed magnetic field(s). The determined voltage(s) may be used to determine the load impedance of an antenna of the RF transmitter that transmits the RF signals. The load impedance may be used to accurately measure the true power provided by the power amplifier regardless of any impedance mismatches between the power amplifier and the antenna.

Such a power detector may be used in conjunction with or implemented in a power controller that is configured to adjust the power provided by the power amplifier and/or an antenna tuning unit that is configured to adjust an operational characteristic (e.g., a bandwidth, a quality factor, a gain, a center frequency, and/or a frequency response) of the antenna based on a measure of power determined by the power detector. For example, if the determined power is below a certain threshold, the power provided by the power amplifier may be increased. In contrast, if the determined power is above a certain threshold (e.g., a regulatory power limit), the power provided by the power amplifier may be decreased. The measured power may also be used to determine the strength at which the RF signal is provided by the antenna. The determined RF signal strength may be provided as a Transmitter Signal Strength Indication (TSSI), which can be displayed to a user of a device to indicate the RF signal strength.

In particular, a power detector is described herein. The power detector includes a first voltage detector, a second voltage detector, a sense inductor-based voltage detector and power determination logic. The first voltage detector is coupled to an input of a transformer that is coupled between a power amplifier and an antenna of the RF transmitter. The first voltage detector is configured to determine a first voltage associated with the input of the transformer. The second voltage detector is coupled to an output of the transformer. The second voltage detector is configured to determine a second voltage associated with the output of the transformer. The sense inductor-based voltage detector is coupled to the transformer and configured to determine a third voltage associated with transformer. The power determination logic is configured to determine an amount of power provided by the power amplifier based on the first voltage, the second voltage, and the third voltage.

A method for determining an amount power provided by a power amplifier of an RF transmitter, wherein the power amplifier provides an RF signal to an antenna of the RF transmitter for transmission thereby, is also described herein. In accordance with the method, one or more voltages associated with a transformer coupled to the power amplifier are determined, wherein the transformer includes a primary coil and a secondary coil. A load impedance of the antenna is determined based on the one or more voltages. The amount of power provided by the power amplifier is determined based on the load impedance.

Another power detector is described herein. The power detector includes a first voltage detector, a second voltage detector, a plurality of sense inductor-based voltage detectors and power determination logic. The first voltage detector is coupled to an input of a transformer coupled between a power amplifier and an antenna of a RF transmitter. The first voltage detector is configured to determine a first voltage associated with the input of the transformer. The second voltage detector is coupled to an output of a transformer. The second voltage detector is configured to determine a second voltage associated with the output of the transformer. The plurality of sense inductor-based voltage detectors are coupled to the transformer and configured to determine a plurality of third voltages associated with transformer. The power determination logic is configured to determine an amount of power provided by the power amplifier based on the first voltage, the second voltage, and the plurality of third voltages.

FIG. 1 depicts a block diagram of an example electronic device 100 that is operable to carry out wireless communication in accordance with an embodiment. As shown in FIG. 1, electronic device 100 includes an RF transmitter 102 that is configured to transmit RF signals 106 to another device (not shown). RF transmitter 102 may be configured to transmit RF signals in accordance with one or more protocols/standards. For example, RF transmitter 102 may be configured to transmit RF signals in accordance with certain RF-based short-range communication technologies such as Bluetooth™, as described in the various standards developed and licensed by the Bluetooth™ Special Interest Group, or technologies such as ZigBee® that are based on the IEEE 802.15.4 standard for wireless personal area networks (specifications describing ZigBee are publically available from the ZigBee® Alliance). In another example, RF transmitter 102 may be configured to transmit RF signals in accordance with one or more cellular standards, such as Code Division Multiple Access (CDMA), Time Division Multiple Access (TDMA), Frequency Division Multiple Access (FDMA), Frequency Division Duplex (FDD), Global System for Mobile Communications (GSM), Wideband-CDMA (W-CDMA), Time Division Synchronous CDMA (TD-SCDMA), Long-Term Evolution (LTE), Time-Division Duplex LTE (TDD-LTE) system, and/or the like. In yet another example, RF transmitter 102 may be configured to transmit RF signals in accordance with other RF-based communication technologies such as any of the well-known IEEE 802.11 protocols. It is noted that RF transmitter 102 may include other components that are not shown in FIG. 1 and/or may be included as part of an RF transceiver.

As further shown in FIG. 1, electronic device 100 also includes a power detector 104. Power detector 104 is configured to determine the true power provided by a power amplifier of RF transmitter 102. Power detector 104 is configured to determine the true power accurately regardless of impedance mismatches between the power amplifier and an antenna of RF transmitter 102. In accordance with an embodiment, the foregoing may be achieved by use of a plurality of voltage detectors that determine voltage(s) associated with the power amplifier and/or a transformer that couples the power amplifier to the antenna. One or more of the voltage detectors may each comprise a sense inductor that senses magnetic field(s) emitted by the transformer. Using the determined voltages, the load impedance of the antenna may be determined. The load impedance may be used to accurately determine the true power provided by the power amplifier.

Examples of electronic device 100 include, but are not limited to, desktop computers, laptop computers, wearable devices, mobile phones, cameras, media players, gaming controllers, wireless headsets, wired or wireless access points, routers and/or any electronic device configured to transmit signals wirelessly.

Figure 2:
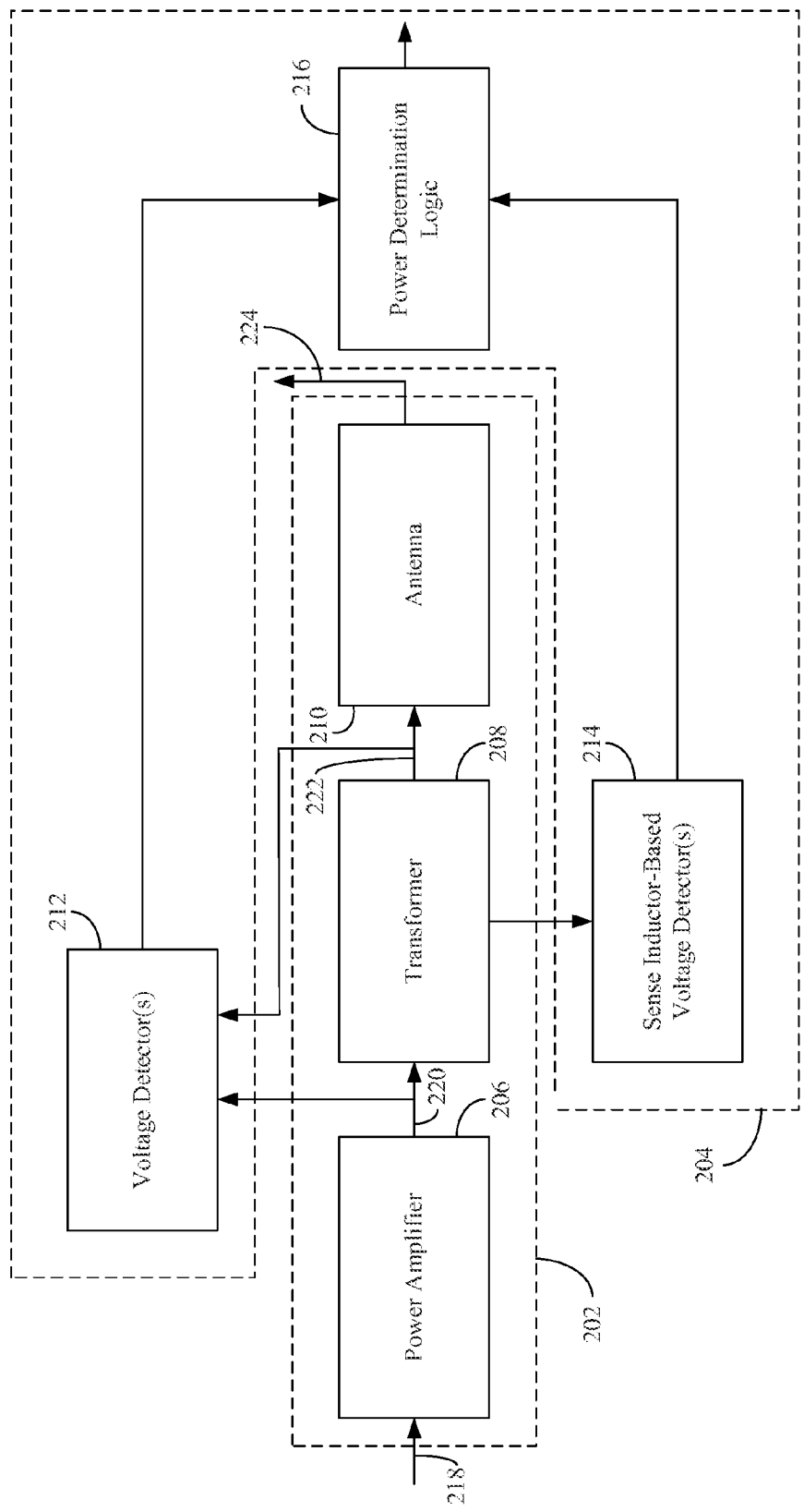
FIG. 2 is a block diagram of an example RF transmitter and a power detector in accordance with an embodiment.

FIG. 2 depicts a block diagram of an example RF transmitter 202 and a power detector 204 in accordance with an embodiment. RF transmitter 202 may be an example of RF transmitter 102, and power detector 204 may be an example of power detector 104, as respectively shown in FIG. 1.

As shown in FIG. 2, RF transmitter 202 includes a power amplifier 206, a transformer 208, and an antenna 210. Transformer 208 is coupled between power amplifier 206 and antenna 210. Power amplifier 206 is configured to receive an RF signal 218 and to amplify RF signal 218 to output an amplified RF signal 220. Amplified RF signal 220 is provided to transformer 208. Transformer 208 may comprise two inductors that are magnetically coupled to each other during operation of RF transmitter 202. Transformer 208 is configured to convert amplified RF signal 220 to an RF signal (i.e., converted RF signal 222) that is suitable for transmission by antenna 210. Converted RF signal 222 is provided by transformer 208 to antenna 210. Antenna 210 is configured to wirelessly transmit converted RF signal 222 to another device (shown in FIG. 2 as transmitted signal 224).

As further shown in FIG. 2, power detector 204 includes one or more voltage detectors 212, one or more sense inductor-based voltage detectors 214, and power determination logic 216. Voltage detector(s) 212 are configured to determine an input voltage of transformer 208 (i.e., a voltage of amplified RF signal 220 that is output by power amplifier 206 and input to transformer 208) and an output voltage of transformer 208. Each one of sense inductor-based voltage detector(s) 214 is coupled to a corresponding sense inductor (not shown). Each sense inductor is magnetically coupled to the coils of transformer 208 during operation of RF transmitter 202. When magnetically coupled in this manner, a voltage is induced across each sense inductor. Each of sense inductor-based voltage detector(s) 214 are configured to detect the induced voltage across the corresponding sense inductor coupled thereto. The voltages determined by voltage detector(s) 212 and/or sense inductor-based voltage detectors 214 are provided to power determination logic 216.

Power determination logic 216 is configured to determine a true power provided by power amplifier 206. Power determination logic 216 determines the true power based on a load impedance of antenna 210, which is determined based on the voltage(s) determined by voltage detector(s) 212 and/or sense inductor-based voltage detector(s) 214. The accuracy of the determined load impedance is improved as the number of sense inductors used to sense the magnetic field(s) emitted by the inductor(s) of transformer 208 increases.

Power determination logic 216 (and/or other components shown in FIG. 2) can be implemented in hardware, software executed by a processing unit, or as a combination thereof.

The following subsections describe different embodiments of power detector 204. In particular, subsection A describes an embodiment in which power detector 204 is implemented using one sense inductor-based voltage detector. Subsection B describes an embodiment in which power detector 204 is implemented using two sense inductor-based voltage detectors. Subsection C describes an embodiment in which power detector 204 is implemented using more than two sense inductor-based voltage detectors.

A. Power Detector with One Sense Inductor-Based Voltage Detector

Figure 3:
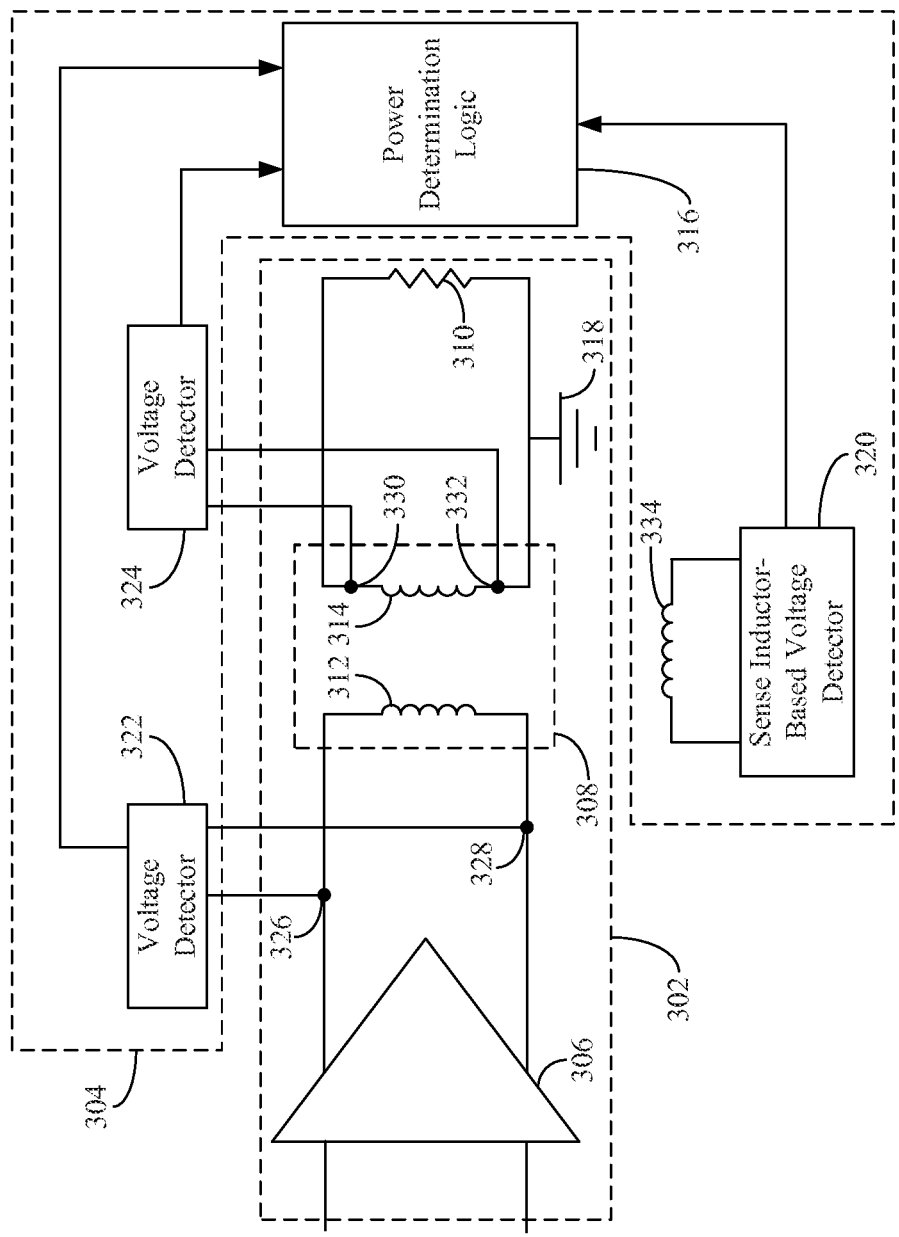
FIG. 3 is a circuit diagram of an example RF transmitter and power detector that includes one sense inductor-based voltage detector in accordance with an embodiment.

FIG. 3 depicts a circuit diagram of an example RF transmitter 302 and power detector 304 that includes one sense inductor-based voltage detector 320 in accordance with an embodiment. RF transmitter 302 may be an example of RF transmitter 202 and power transmitter 304 may be an example of power transmitter 204, as respectively shown in FIG. 2. As shown in FIG. 3, RF transmitter 302 includes a power amplifier 306, a transformer 308, and an antenna (represented by a resistor 310). Power amplifier 306 may be an example of power amplifier 206, transformer 308 may be an example of transformer 208, and antenna 310 may be an example of antenna 210, as respectively shown in FIG. 2.

As further shown in FIG. 3, power amplifier 306 is a differential power amplifier that is configured to amplify a differential RF input signal and provide an amplified, differential RF output signal. The amplified, differential RF output signal is provided to transformer 208. Transformer 308 comprises a pair of coils (i.e., a primary coil 312 and a secondary coil 314). Primary coil 312 is coupled to the amplified, differential RF output signals provided by power amplifier 306. Secondary coil 314 is coupled between antenna 310 and a ground 318. In accordance with an embodiment, transformer 308 is a balanced signal to unbalanced signal converter (i.e. a balun) that converts the amplified, differential RF output signals provided by power amplifier 306 (which are balanced signals) to a single, unbalanced (i.e., a single-ended) RF output signal that is provided to antenna 310 for transmission. Antenna 310 is coupled between secondary coil 314 and ground 318. Antenna 310 is configured to wirelessly transmit the single-ended RF output signal provided by transformer 308 to another device.

As further shown in FIG. 3, power detector 304 includes a first voltage detector 322, a second voltage detector 324, a sense inductor-based voltage detector 320, and power determination logic 316. First voltage detector 322 and second voltage detector 324 may be examples of voltage detector(s) 212, and sense inductor-based voltage detector 320 may be an example of sense-inductor based voltage detector(s) 214, as respectively shown in FIG. 2.

First voltage detector 322 is coupled to the amplified, differential RF output signals provided by power amplifier 306 at a node 326 and a node 328. First voltage detector 322 is configured to determine an input voltage of transformer 308 by measuring the voltages of the differential RF output signals input to transformer 308. Second voltage detector 324 is coupled to a node 330 at a first terminal of secondary coil 314 and a node 332 at a second terminal of secondary coil 314. Second voltage detector 324 is configured to detect an output voltage of transformer 308.

Sense inductor-based voltage detector 320 is coupled to a sense inductor 334, which is configured to be magnetically coupled to each of primary coil 312 and secondary coil inductor 314. When magnetically coupled to primary coil 312 and secondary coil 314, a voltage is induced across sense inductor 334. Sense inductor-based voltage detector 320 is configured to detect the induced voltage across sense inductor 334. The voltages determined by first voltage detector 322, second voltage detector 324, and sense inductor-based voltage detector 320 are provided to power determination logic 316.

Power determination logic 316 is configured to determine a true power provided by power amplifier 306. Power determination logic 316 may determine the true power by determining a current across secondary coil 314 and a load impedance of antenna 310. In accordance with an embodiment, the true power may be determined in accordance with Equation 1, which is provided below:

$$\text{RF Power} = |I2|^2 \cdot \text{real}(ZL) \quad \text{(Equation 1)}$$

where I2 corresponds to a current across secondary coil 314 and real(ZL) corresponds to a real part of the complex load impedance of antenna 310.

An equation that may be used to determine Real(ZL) and I2 may be derived based on relationships between one or more characteristics of primary coil 312, secondary coil 314, and sense inductor 334 and the voltages determined by first voltage detector 322, second voltage detector 324 and sense-inductor-based voltage detector 320. For example, Equation 2 shows an equation for determining the input voltage of transformer 308 (V1), the output voltage of transformer 308 (V2), and the voltage induced across sense inductor 334 (V3):

$$\begin{bmatrix} V1 \\ V2 \\ V3 \end{bmatrix} = j\omega \begin{bmatrix} L1 & M \\ M & L2 \\ M3 & M4 \end{bmatrix} \begin{bmatrix} I1 \\ I2 \end{bmatrix} + \begin{bmatrix} R1 & 0 \\ 0 & R2 \\ 0 & 0 \end{bmatrix} \begin{bmatrix} I1 \\ I2 \end{bmatrix} \quad \text{(Equation 2)}$$

$$= \begin{bmatrix} j\omega L1 + R1 & j\omega M \\ j\omega M & j\omega L2 + R2 \\ j\omega M3 & j\omega M4 \end{bmatrix} \begin{bmatrix} I1 \\ I2 \end{bmatrix}$$

where L1 is an inductance of primary coil primary coil 312, L2 is an inductance of secondary coil 314, M is a mutual inductance between primary coil 312 and secondary coil 314, M3 is a mutual inductance between sense inductor 334 and primary coil 312, M4 is a mutual inductance between sense inductor 334 and secondary coil 314, R1 is the resistance of primary coil 312 and R2 is the resistance of secondary coil 314.

Expanding out Equation 2 yields the following equations:

$$V1 = j\omega L1 \cdot I1 + j\omega M \cdot I2 + I1 \cdot R1 \quad \text{(Equation 3)}$$

$$V2 = j\omega M \cdot I1 + j\omega L2 \cdot I2 + I2 \cdot R2 \quad \text{(Equation 4)}$$

$$V3 = j\omega M3 \cdot I1 + j\omega M4 \cdot I2 \quad \text{(Equation 5)}$$

Solving for V2 in terms of a complex load impedance of antenna 310 yields Equation 6, which is shown below:

$$V2 = -I2 \cdot ZL \quad \text{(Equation 6)}$$

Using Equations 4 and 6, the current across primary coil 312 (I1) may be solved for in terms of ZL, as shown below in Equation 7:

$$I1 = \frac{-ZL - j\omega L2 - R2}{j\omega M} \cdot I2 = \frac{j\frac{ZL + R2}{\omega} - L2}{M} \cdot I2 \quad \text{(Equation 7)}$$

Next, each of Equations 3, 4 and 5 may be rewritten in terms of a respective voltage squared term, where the voltage squared term is equal to a dot product of a respective voltage and its conjugate as shown below in Equations 8, 9 and 10:

$$|V1|^2 = V1 \cdot V1^* \quad \text{(Equation 8)}$$
$$= \omega^2 L1^2(|I1|^2) + \omega^2 M \cdot L1(I1 \cdot I2^* + I2 \cdot I1^*) +$$
$$\omega^2 M^2(|I2|^2) +$$
$$j\omega MR1 \cdot (I2 \cdot I1^* - I1 \cdot I2^*) + |I1|^2 R1^2$$

$$|V2|^2 = V2 \cdot V2^* \quad \text{(Equation 9)}$$
$$= \omega^2 M^2(|I1|^2) + \omega^2 M \cdot L2(I1 \cdot I2^* + I2 \cdot I1^*) +$$
$$\omega^2 L2^2(|I2|^2) -$$
$$j\omega MR2(I2I1^* - I1I2^*) + |I2|^2 R2^2$$

$$|V3|^2 = V3 \cdot V3^* \quad \text{(Equation 10)}$$
$$= \omega^2 M3^2(|I1|^2) + \omega^2 M3M4(I1 \cdot I2^* + I2 \cdot I1^*) +$$
$$\omega^2 M4^2(|I2|^2)$$

As shown above, each of Equations 8, 9 and 10 yield four common terms that are each based on I1 and/or I2 (i.e., $|I1|^2$, (I1·I2*+I2·I1*), (I2·I1*−I1·I2*) and ($|I2|^2$)). Based on Equation 7, $|I1|^2$ and I1·I2* may be rewritten in terms of $|I2|^2$, as shown below in Equations 11 and 12:

$$|I1|^2 = I1 \cdot I1^* \quad \text{(Equation 11)}$$

$$= \left( \frac{\frac{ZL \cdot ZL^* + R2(ZL + ZL^*) + R2^2}{\omega^2} +}{M^2} \right) \cdot (I2 \cdot I2^*)$$

$$= \left( \frac{\frac{ZL \cdot ZL^* + R2 \cdot 2 \cdot \text{real}(ZL) + R2^2}{\omega^2} + 2 \cdot \frac{L2}{\omega} \text{imag}(ZL) + L2^2}{M^2} \right) \cdot |I2|^2$$

$$I1 \cdot I2^* = \left( \frac{-j\frac{ZL + R2}{\omega} - L2}{M} \right) \cdot |I2|^2 \quad \text{(Equation 12)}$$

where real(ZL) and imag(ZL) correspond to real and imaginary part of the complex load impedance of antenna 310.

Based on Equation 12, common terms I1·I2*+I2·I1* and I2·I1*−I1·I2* can be rewritten in terms of $|I2|^2$, as respectively shown below in Equations 13 and 14:

$$I1 \cdot I2^* + I2 \cdot I1^* = |I2|^2 \cdot \left( \frac{j\frac{ZL - ZL^*}{\omega} - 2L2}{M} \right) \quad \text{(Equation 13)}$$

$$= |I2|^2 \cdot \left( \frac{-\frac{2\text{imag}(ZL)}{\omega} - 2L2}{M} \right)$$

$$-I1 \cdot I2^* + I2 \cdot I1^* = |I2|^2 \cdot \quad \text{(Equation 14)}$$

$$\left( \frac{-j\left(\frac{ZL + ZL^* + 2 \cdot R2}{\omega}\right)}{M} \right)$$

$$= |I2|^2 \cdot$$

$$\left( \frac{\frac{-2j \cdot \text{real}(ZL) - 2j \cdot R2}{\omega}}{M} \right)$$

Finally, Equations, 8, 9 and 10 can be rewritten such that the common terms $|I1|^2$ I1·I2*+I2·I1* and I2·I1*−I1·I2* are replaced with Equations 11, 13 and 14, respectively. This is shown below in Equation 15:

$$= \begin{bmatrix} \left(\frac{(\omega^2 L1^2 + R1^2)}{\omega^2 M^2}\right) & \left(\frac{2(\omega^2 L1^2 + R1^2)R2}{\omega^2 M^2} + 2R1\right) & \left(\frac{2(\omega^2 L1^2 + R1^2)L2}{\omega M^2} - 2\omega L1\right) & \begin{pmatrix} \frac{(\omega^2 L1^2 + R1^2)R2^2}{\omega^2 M^2} + \\ \frac{(\omega^2 L1^2 + R1^2)L2^2}{M^2} - \\ 2\omega^2 L1L2 + 2R1R2 + \omega^2 M^2 \end{pmatrix} \\ (1) & (0) & (0) & (0) \\ \left(\frac{M3^2}{M^2}\right) & \left(\frac{2M3^2 R2}{M^2}\right) & \left(\frac{2\omega M3^2 L2}{M^2} - \frac{2\omega M3M4}{M}\right) & \begin{pmatrix} \frac{M3^2 R2^2}{M^2} + \frac{\omega^2 M3^2 L2^2}{M^2} - \\ \frac{2\omega^2 M3M4L2}{M} + \omega^2 M4^2 \end{pmatrix} \end{bmatrix} \times \quad \text{(Equation 15)}$$

$$\begin{bmatrix} |I2|^2(\text{real}(ZL)^2 + \text{imag}(ZL)^2) \\ |I2|^2 \text{real}(ZL) \\ |I2|^2 \text{imag}(ZL) \\ |I2|^2 \end{bmatrix}$$

For simplicity, the left matrix of Equation 15 may be represented by a variable A, thereby yielding Equation 16, which is shown below:

$$\begin{bmatrix} |V1|^2 \\ |V2|^2 \\ |V3|^2 \end{bmatrix} = A \begin{bmatrix} |I2|^2(\text{real}(ZL)^2 + \text{imag}(ZL)^2) \\ |I2|^2 \text{real}(ZL) \\ |I2|^2 \text{imag}(ZL) \\ |I2|^2 \end{bmatrix} \quad \text{(Equation 16)}$$

$|I2|^2$, real(ZL) and imag(ZL) may be solved for by obtaining a three-variable, three equation linear system. The linear system may be obtained by first rewriting Equation 16 as follows:

$$\begin{bmatrix} 0 \\ 0 \\ 0 \end{bmatrix} = A1 \begin{bmatrix} 1 \\ |I2|^2(\text{real}(ZL)^2 + \text{imag}(ZL)^2) \\ |I2|^2 \text{real}(ZL) \\ |I2|^2 \text{imag}(ZL) \\ |I2|^2 \end{bmatrix} \quad \text{(Equation 17)}$$

where A1 corresponds to $$\begin{bmatrix} -|V1|^2 \\ -|V2|^2 \\ -|V3|^2 \end{bmatrix} + A.$$

Next, the reduced row echelon form for matrix A1 may be obtained, which is shown below in Equation 18.

$$K = \begin{bmatrix} 1 & 0 & 0 & k14 & k15 \\ 0 & 1 & 0 & k24 & k25 \\ 0 & 0 & 1 & k34 & k35 \end{bmatrix} \quad \text{(Equation 18)}$$

where k14, k15, k24, k25, k34 and k35 represent values obtained after obtaining the reduced row echelon form. The values for k14, k15, k24, k25, k34 and k35 are not shown for sake of brevity.

Substituting K for A1 of Equation 17 yields Equation 19, which is shown below:

$$\begin{bmatrix} 0 \\ 0 \\ 0 \end{bmatrix} = \begin{bmatrix} 1 & 0 & 0 & k14 & k15 \\ 0 & 1 & 0 & k24 & k25 \\ 0 & 0 & 1 & k34 & k35 \end{bmatrix} \begin{bmatrix} 1 \\ |I2|^2(\text{real}(ZL)^2 + \text{imag}(ZL)^2) \\ |I2|^2 \text{real}(ZL) \\ |I2|^2 \text{imag}(ZL) \\ |I2|^2 \end{bmatrix} \quad \text{(Equation 19)}$$

Expanding out Equation 19 yields the three-variable, three equation linear system, which is shown below as Equations 20, 21 and 22:

$$0 = 1 + (k14 \times |I2|^2 \text{imag}(ZL)) + (k15 \times |I2|^2) \quad \text{(Equation 20)}$$

$$0 = |I2|^2(\text{real}(ZL)^2 + \text{imag}(ZL)^2) + (k24 \times |I2|^2 \text{imag}(ZL)) + (k25 \times |I2|^2) \quad \text{(Equation 21)}$$

$$0 = |I2|^2 \text{real}(ZL) + (k34 \times |I2|^2 \text{imag}(ZL)) + (k35 \times |I2|^2) \quad \text{(Equation 22)}$$

The three-variable, three equation linear system may be used to solve for $|I2|^2$, real(ZL) and imag(ZL). For example, $|I2|^2$, real(ZL) and imag(ZL) may be solved for in terms of a quadratic equation formed using Equations 20, 21 and 22, as shown below:

$$0 = (1 + k34^2) \times \text{imag}(ZL)^2 + (k24 + 2 \cdot k34 \cdot k45) \times \text{imag}(ZL) + (k25 + k35^2) \quad \text{(Equation 23)}$$

$$\text{real}(ZL) = -k34 \times \text{imag}(ZL) - k35 \quad \text{(Equation 24)}$$

$$|I2|^2 = 1/(\text{imag}(ZL) \times k14 + k15) \quad \text{(Equation 25)}$$

Once $|I2|^2$ and real(ZL) are determined, the true power provided by power amplifier 306 may be determined in accordance with Equation 1, as described above. It is noted that the quadratic equation (Equation 23) yields two solutions for imag(ZL). The larger of the two solutions is used for $|I2|^2$ real(ZL), as it is a reasonable measure of the impedance of antenna 310 (whereas the smaller of the two solutions is a reasonable measure for a bad impedance mismatch).

B. Power Detector with Two Sense Inductor-Based Voltage Detectors

Figure 4:
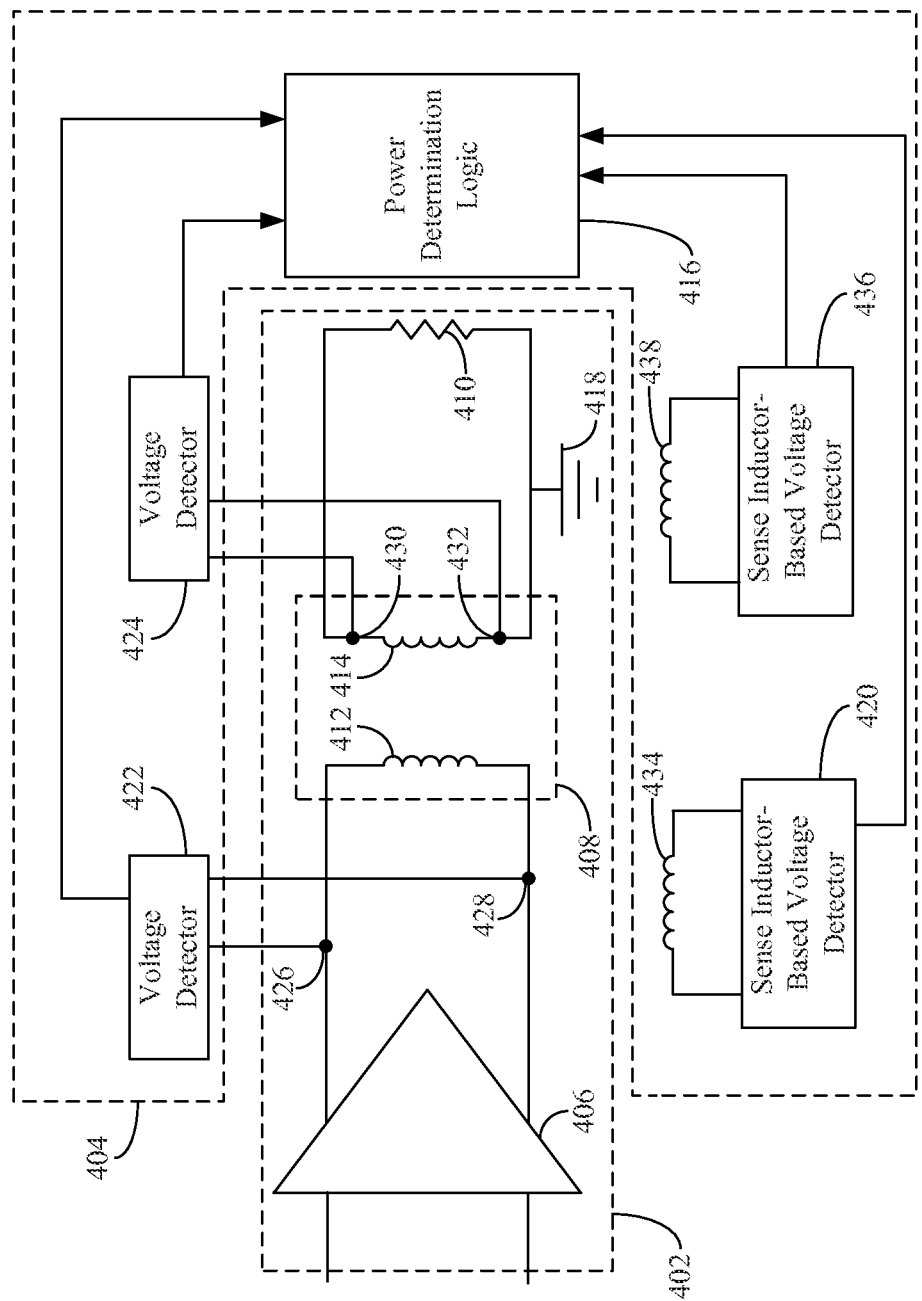
FIG. 4 is a circuit diagram of an example RF transmitter and power detector that includes two sense inductor-based voltage detectors in accordance with an embodiment.

FIG. 4 depicts a circuit diagram of an example RF transmitter 402 and power detector 404 that includes two sense inductor-based voltage detectors (i.e., a first sense inductor-based voltage detector 420 and a second sense inductor-based voltage detector 436) in accordance with an embodiment. RF transmitter 402 may be an example of RF transmitter 202, and power detector 404 may be an example of power detector 204, as respectively shown in FIG. 2. As shown in FIG. 4, RF transmitter 402 includes a power amplifier 406, a transformer 408, and an antenna (represented by a resistor 410). Power amplifier 406 may be an example of power amplifier 206, transformer 408 may be an example of transformer 208, and antenna 410 may be an example of antenna 210, as respectively shown in FIG. 2. Power amplifier 406, transformer 408 and antenna 410 each operate in a similar manner as described above with reference to like-named elements in FIG. 2.

Power detector 404 includes a first voltage detector 422, a second voltage detector 424, a first sense inductor-based voltage detector 420, a second sense inductor-based voltage detector 436 and power determination logic 416. First voltage detector 422 and second voltage detector 424 may be examples of voltage detector(s) 212 as shown in FIG. 2. First sense inductor-based voltage detector 420 and second sense inductor-based voltage detector 436 may be examples of sense inductor-based voltage detector(s) 214 as shown in FIG. 2. First voltage detector 422, second voltage detector 424 and first sense inductor-based voltage detector 420 may each operate in a similar manner to that described above in reference to like-named elements in FIG. 3 (i.e., first voltage detector 322, second voltage detector 324 and sense inductor-based voltage detector 320). The manner of operation of second sense inductor-based voltage detector 436 and power determination logic 416 will now be described.

Second sense inductor-based voltage detector 436 is coupled to a sense inductor 438, which is configured to be magnetically coupled to each of primary coil 412 and secondary coil 414 during operation of RF transmitter 402. When magnetically coupled to primary coil 412 and secondary coil 414, a voltage is induced across sense inductor 438. Second sense inductor-based voltage detector 426 is configured to detect the induced voltage across sense inductor 438. The voltages determined by first voltage detector 422, second voltage detector 424, first sense inductor-based voltage detector 420 and second sense inductor-based voltage detector 436 are provided to power determination logic 416.

Power determination logic 416 is configured to determine a true power provided by power amplifier 406 in a similar manner as power determination 316. However, power determination logic 416 determines the load impedance of antenna 410 (real(ZL)) and the current across secondary coil 414 (I2) based on the four voltage readings respectively provided by first voltage detector 422, second voltage detector 424, first sense inductor-based voltage detector 420 and second sense inductor-based voltage detector 436 (whereas power determination logic 316 determines the load impedance based on three voltage readings respectively provided by first voltage detector 322, second voltage detector 324 and sense inductor-based voltage detector 320). It has been observed that the use of the additional voltage reading by power determination logic 416 results in a more accurate determination of the load impedance of antenna 410 and the current across secondary coil 414 (which, in turn, results in a more accurate true power determination).

As described above in subsection A, the true power may be determined in accordance with Equation 1.

Power determination logic 416 may be configured to determine $|I2|^2$ and Real(ZL) based on an equation that is derived based on relationships between characteristic(s) of primary coil 412, secondary coil 414, sense inductor 434, sense inductor 438 and the voltage(s) determined by first voltage detector 422, second voltage detector 424, first sense inductor-based voltage detector 420 and second sense inductor-based voltage detector 436 in a similar manner as described above in subsection A. For example, For example, Equation 26 shows an equation for determining the input voltage of transformer 408 (V1), the output voltage of transformer 408 (V2), the voltage induced across sense inductor 434 (V3) and the voltage induced across sense inductor 438 (V4):

$$\begin{bmatrix} V1 \\ V2 \\ V3 \\ V4 \end{bmatrix} = j\omega \begin{bmatrix} L1 & M \\ M & L2 \\ M3 & M4 \\ M5 & M6 \end{bmatrix} \begin{bmatrix} I1 \\ I2 \end{bmatrix} + \begin{bmatrix} R1 & 0 \\ 0 & R2 \\ 0 & 0 \\ 0 & 0 \end{bmatrix} \begin{bmatrix} I1 \\ I2 \end{bmatrix} \quad \text{(Equation 26)}$$

$$= \begin{bmatrix} j\omega L1 + R1 & j\omega M \\ j\omega M & j\omega L2 + R2 \\ j\omega M3 & j\omega M4 \\ j\omega M5 & j\omega M6 \end{bmatrix} \begin{bmatrix} I1 \\ I2 \end{bmatrix}$$

Accordingly, the derived equation is shown as follows:

$$\begin{bmatrix} |V1|^2 \\ |V2|^2 \\ |V3|^2 \\ |V4|^2 \end{bmatrix} = \begin{bmatrix} \omega^2 L1^2 + R1^2 & \omega^2 M \cdot L1 & j\omega MR1 & \omega^2 M^2 \\ \omega^2 M^2 & \omega^2 M \cdot L2 & -j\omega MR2 & \omega^2 L2^2 + R2^2 \\ \omega^2 M3^2 & \omega^2 M3M4 & 0 & \omega^2 M4^2 \\ \omega^2 M5^2 & \omega^2 M5M6 & 0 & \omega^2 M6^2 \end{bmatrix} \begin{bmatrix} |I1|^2 \\ I1 \cdot I2^* + I2 \cdot I1^* \\ I2 \cdot I1^* - I1 \cdot I2^* \\ |I2|^2 \end{bmatrix} \quad \text{(Equation 27)}$$

$$= \begin{bmatrix} \omega^2 L1^2 + R1^2 & \omega^2 M \cdot L1 & j\omega MR1 & \omega^2 M^2 \\ \omega^2 M^2 & \omega^2 M \cdot L2 & -j\omega MR2 & \omega^2 L2^2 + R2^2 \\ \omega^2 M3^2 & \omega^2 M3M4 & 0 & \omega^2 M4^2 \\ \omega^2 M5^2 & \omega^2 M5M6 & 0 & \omega^2 M5^2 \end{bmatrix} \begin{bmatrix} |I2|^2 \cdot \left( \dfrac{ZL \cdot ZL^* + R2 \cdot 2 \cdot \text{real}(ZL) + R2^2}{\omega^2} + \dfrac{2 \cdot \dfrac{L2}{\omega}\text{imag}(ZL) + L2^2}{M^2} \right) \\ |I2|^2 \cdot \left( \dfrac{\dfrac{-2\text{imag}(ZL)}{\omega} - 2L2}{M} \right) \\ |I2|^2 \cdot \left( \dfrac{\dfrac{-2j \cdot \text{real}(ZL) \cdot 2j \cdot R2}{\omega}}{M} \right) \\ |I2|^2 \end{bmatrix}$$

$$= \begin{bmatrix} \left(\dfrac{(\omega^2 L1^2 + R1^2)}{\omega^2 M^2}\right) & \left(\dfrac{2(\omega^2 L1^2 + R1^2)R2}{\omega^2 M^2} + 2R1\right) & \left(\dfrac{2(\omega^2 L1^2 + R1^2)L2}{\omega M^2} - 2\omega L1\right) & \left( \begin{array}{l} \dfrac{(\omega^2 L1^2 + R1^2)R2^2}{\omega^2 M^2} + \\ \dfrac{(\omega^2 L1^2 + R1^2)L2^2}{M^2} - \\ 2\omega^2 L1L2 + 2R1R2 + \omega^2 M^2 \end{array} \right) \\ (1) & (0) & (0) & (0) \\ \left(\dfrac{M3^2}{M^2}\right) & \left(\dfrac{2M3^2 R2}{M^2}\right) & \left(\dfrac{2\omega M3^2 L2}{M^2} - \dfrac{2\omega M3M4}{M}\right) & \left( \begin{array}{l} \dfrac{M3^2 R2^2}{M^2} + \dfrac{\omega^2 M3^2 L2^2}{M^2} - \\ \dfrac{2\omega^2 M3M4L2}{M} + \omega^2 M4^2 \end{array} \right) \\ \left(\dfrac{M5^2}{M^2}\right) & \left(\dfrac{2M5^2 R2}{M^2}\right) & \left(\dfrac{2\omega M5^2 L2}{M^2} - \dfrac{2\omega M5M6}{M}\right) & \left( \begin{array}{l} \dfrac{M5^2 R2^2}{M^2} + \dfrac{\omega^2 M5^2 L2^2}{M^2} - \\ \dfrac{2\omega^2 M5M6L2}{M} + \omega^2 M6^2 \end{array} \right) \end{bmatrix} \times$$

$$\begin{bmatrix} |I2|^2(\text{real}(ZL)^2 + \text{imag}(ZL)^2) \\ |I2|^2 \text{real}(ZL) \\ |I2|^2 \text{imag}(ZL) \\ |I2|^2 \end{bmatrix}$$

where L1 is an inductance of primary coil 412, L2 is an inductance of secondary coil 414, M is a mutual inductance between primary coil 412 and secondary coil 414, R1 is a resistance of primary coil 412, R2 is a resistance of secondary coil 414, M3 is a mutual inductance between sense inductor 434 and primary coil 412, M4 is a mutual inductance between sense inductor 434 and secondary coil 414, M5 is a mutual inductance between sense inductor 438 and primary coil 412, M6 is a mutual inductance between sense inductor 438 and secondary coil 414, imag(ZL) corresponds to an imaginary part of the complex load impedance of antenna 410 and real(ZL) corresponds to a real part of the complex load impedance of antenna 410.

For simplicity, the left matrix of Equation 27 may be represented by a variable A, thereby yielding Equation 28, which is shown below:

$$\begin{bmatrix} |V1|^2 \\ |V2|^2 \\ |V3|^2 \\ |V4|^2 \end{bmatrix} = A \begin{bmatrix} |I2|^2(\text{real}(ZL)^2 + \text{imag}(ZL)^2) \\ |I2|^2 \text{real}(ZL) \\ |I2|^2 \text{imag}(ZL) \\ |I2|^2 \end{bmatrix} \quad \text{(Equation 28)}$$

$|I2|^2$ and real(ZL) may be solved for by taking the inverse of A as shown below in Equation 29:

$$\begin{bmatrix} |I2|^2(\text{real}(ZL)^2 - \text{imag}(ZL)^2) \\ |I2|^2 \text{real}|ZL|^2 \\ \text{imag}(ZL) \\ |I2|^2 \end{bmatrix} = A^{-1} \begin{bmatrix} |V1|^2 \\ |V2|^2 \\ |V3|^2 \\ |V4|^2 \end{bmatrix} \quad \text{(Equation 29)}$$

Once $|I2|^2$ and real(ZL) are determined, the true power provided by power amplifier 406 may be determined in accordance with Equation 1, as described above.

C. Power Detector with More than Two Sense Inductor-Based Voltage Detector

Figure 5:
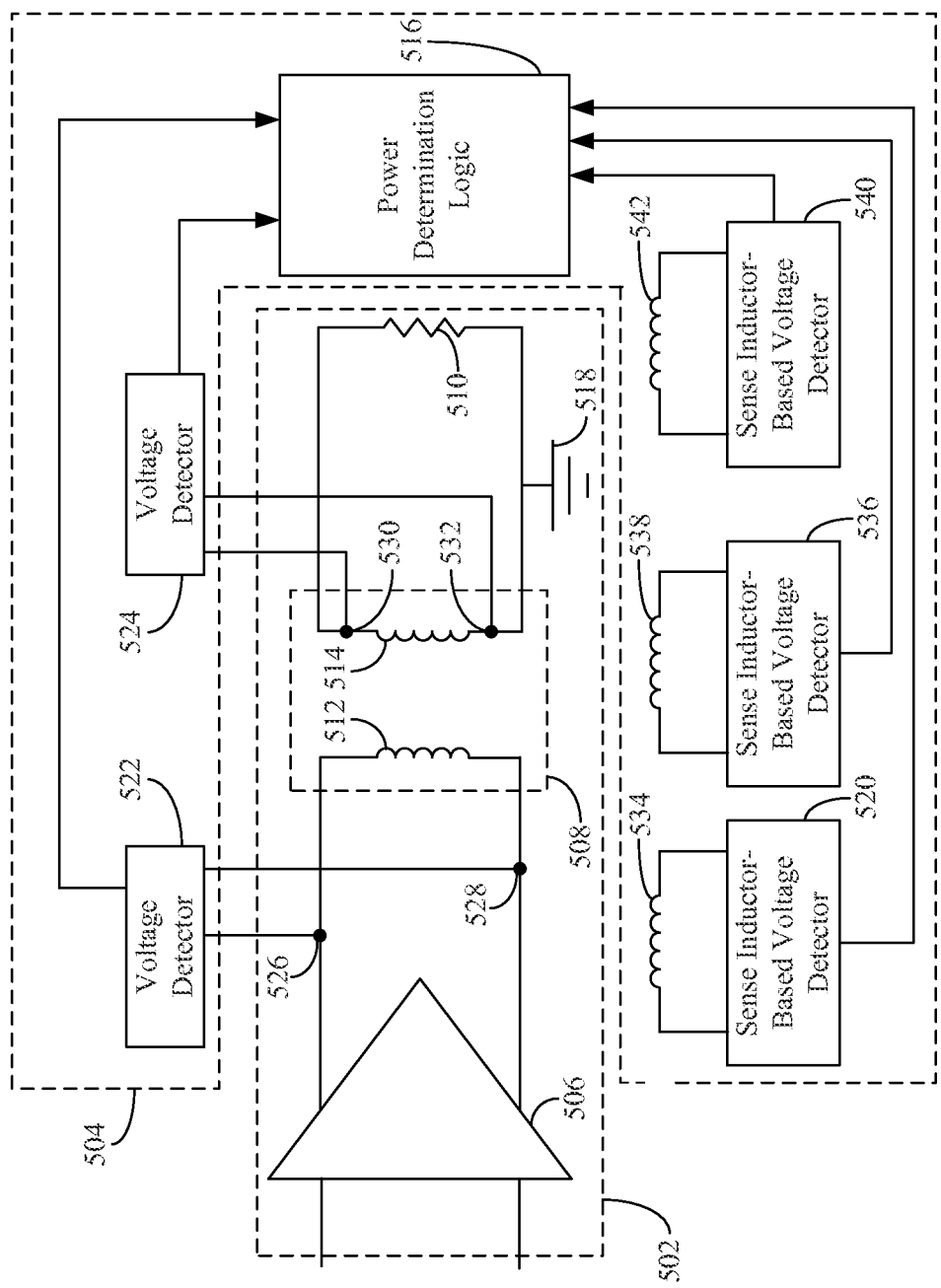
FIG. 5 is a circuit diagram of an example RF transmitter and power detector that includes more than two sense inductor-based voltage detectors in accordance with an embodiment.

FIG. 5 depicts a circuit diagram of an example RF transmitter 502 and power transmitter 504 that includes more than two sense inductor-based voltage detectors (i.e., a first sense inductor-based voltage detector 520, a second sense inductor-based voltage detector 536 and a third sense inductor-based voltage detector 540) in accordance with an embodiment. RF transmitter 502 may be an example of RF transmitter 202, and power detector 504 may be an example of power detector 204, as respectively as shown in FIG. 2. As shown in FIG. 5, RF transmitter 502 includes a power amplifier 506, a transformer 508, and an antenna (represented by a resistor 510). Power amplifier 506 may be an example of power amplifier 206, transformer 508 may be an example of transformer 208, and antenna 510 may be an example of antenna 210, as respectively shown in FIG. 2. Power amplifier 506, transformer 508 and antenna 510 each operate in a similar manner as described above with reference to like-named elements in FIG. 2.

Power detector 504 includes a first voltage detector 522, a second voltage detector 524, a first sense inductor-based voltage detector 520, a second sense inductor-based voltage detector 536, a third sense inductor-based voltage detector 540 and power determination logic 516. Only three sense inductor-based voltage detectors are shown for sake of brevity. However, it will be recognized that power detector 504 can have any number of sense inductor-based voltage detectors. First voltage detector 522 and second voltage detector 524 may be examples of voltage detector(s) 212 as shown in FIG. 2. First sense inductor-based voltage detector 520, second sense inductor-based voltage detector 536 and third sense inductor-based voltage detector 540 may be examples of sense inductor-based voltage detector(s) 214 as shown in FIG. 2. First voltage detector 522, second voltage detector 524, first sense inductor-based voltage detector 520 and second sense inductor-based voltage detector 536 may each operate in a similar manner to that described above in reference to like-named elements in FIG. 4 (i.e., first voltage detector 422, second voltage detector 424, first sense inductor-based voltage detector 420 and second sense inductor-based voltage detector 436. The manner of operation of third sense inductor-based voltage detector 540 and power determination logic 516 will now be described.

Third sense inductor-based voltage detector 540 is coupled to a sense inductor 542, which is configured to be magnetically coupled to each of primary coil 512 and secondary coil 514 during operation of RF transmitter 502. When magnetically coupled to primary coil 512 and secondary coil 514, a voltage is induced across sense inductor 542. Third sense inductor-based voltage detector 540 is configured to detect the induced voltage across sense inductor 542. The voltages determined by first voltage detector 522, second voltage detector 524, first sense inductor-based voltage detector 520, second sense inductor-based voltage detector 536 and third sense inductor-based voltage detector 540 are provided to power determination logic 516.

Power determination logic 516 is configured to determine a true power provided by power amplifier 506 in a similar manner as power determination logic 416. However, power determination logic 516 determines the load impedance of antenna 510 (real(ZL)) and the current across secondary coil 514 (I2) based on five voltage readings respectively provided by first voltage detector 522, second voltage detector 524, first sense inductor-based voltage detector 520, second sense inductor-based voltage detector 536 and third sense inductor-based voltage detector 540. In contrast, power determination logic 416 determines the load impedance based on four voltage readings respectively provided by first voltage detector 422, second voltage detector 424, first sense inductor-based voltage detector 420 and second sense inductor-based voltage detector 436. It has been observed that the use of the additional voltage reading by power determination logic 516 results in a more accurate determination of the load impedance of antenna 510 and the current across secondary coil 514 (which, in turn, results in a more accurate true power determination).

As described above in subsections A and B, the true power may be determined in accordance with Equation 1.

Power determination logic 516 may be configured to determine $|I2|^2$ and Real(ZL) based on an equation that is derived based on relationships between characteristic(s) of primary coil 512, secondary coil 514, sense inductor 534, sense inductor 538, sense inductor 542 and the voltages determined by first voltage detector 522, second voltage detector 524, first sense inductor-based voltage detector 520, second sense inductor-based voltage detector 536 and third sense inductor-based voltage detector 540 in a similar manner as described above in subsections A and B. For example, For example, Equation 30 shows an equation for determining the input voltage of transformer 508 (V1), the output voltage of transformer 508 (V2), the voltage induced across sense inductor 534 (V3), the voltage induced across sense inductor 438 (V4) and the voltage induced across sense inductor 542 (V5):

$$\begin{bmatrix} V1 \\ V2 \\ V3 \\ V4 \\ V5 \end{bmatrix} = j\omega \begin{bmatrix} L1 & M \\ M & L2 \\ M3 & M4 \\ M5 & M6 \\ M7 & M8 \end{bmatrix} \begin{bmatrix} I1 \\ I2 \end{bmatrix} + \begin{bmatrix} R1 & 0 \\ 0 & R2 \\ 0 & 0 \\ 0 & 0 \\ 0 & 0 \end{bmatrix} \begin{bmatrix} I1 \\ I2 \end{bmatrix} \quad \text{(Equation 30)}$$

$$= \begin{bmatrix} j\omega L1 + R1 & j\omega M \\ j\omega M & j\omega L2 + R2 \\ j\omega M3 & j\omega M4 \\ j\omega M5 & j\omega M6 \\ j\omega M7 & j\omega M8 \end{bmatrix} \begin{bmatrix} I1 \\ I2 \end{bmatrix}$$

Accordingly, the derived equation is shown as follows:

$$\begin{bmatrix} |V1|^2 \\ |V2|^2 \\ |V3|^2 \\ |V4|^2 \\ |V5|^2 \end{bmatrix} = \begin{bmatrix} \omega^2 L1^2 + R1^2 & \omega^2 M \cdot L1 & j\omega MR1 & \omega^2 M^2 \\ \omega^2 M^2 & \omega^2 M \cdot L2 & -j\omega MR2 & \omega^2 L2^2 + R2^2 \\ \omega^2 M3^3 & \omega^2 M3M4 & 0 & \omega^2 M4^2 \\ \omega^2 M5^2 & \omega^2 M5M6 & 0 & \omega^2 M6^2 \\ \omega^2 M7^2 & \omega^2 M7M8 & 0 & \omega^2 M8^2 \end{bmatrix} \begin{bmatrix} |I1|^2 \\ I1 \cdot I2^* + I2 \cdot I1^* \\ I2 \cdot I1^* - I1 \cdot I2^* \\ |I2|^2 \end{bmatrix} \quad \text{(Equation 31)}$$

$$= \begin{bmatrix} \omega^2 L1^2 + R1^2 & \omega^2 M \cdot L1 & j\omega MR1 & \omega^2 M^2 \\ \omega^2 M^2 & \omega^2 M \cdot L2 & -j\omega MR2 & \omega^2 L2^2 + R2^2 \\ \omega^2 M3^3 & \omega^2 M3M4 & 0 & \omega^2 M4^2 \\ \omega^2 M5^2 & \omega^2 M5M6 & 0 & \omega^2 M5^2 \\ \omega^2 M7^2 & \omega^2 M7M8 & 0 & \omega^2 M8^2 \end{bmatrix} \begin{bmatrix} |I2|^2 \cdot \left( \dfrac{\dfrac{ZL \cdot ZL^* + R2 \cdot 2 \cdot \text{real}(ZL) + R2^2}{\omega^2} + 2 \cdot \dfrac{L2}{\omega} \text{imag}(ZL) + L2^2}{M^2} \right) \\ |I2|^2 \cdot \left( \dfrac{\dfrac{-2\text{imag}(ZL)}{\omega} - 2L2}{M} \right) \\ |I2|^2 \cdot \left( \dfrac{\dfrac{-2j \cdot \text{real}(ZL) \cdot 2j \cdot R2}{\omega}}{M} \right) \\ |I2|^2 \end{bmatrix}$$

$$= \begin{bmatrix} \left( \dfrac{(\omega^2 L1^2 + R1^2)}{\omega^2 M^2} \right) & \left( \dfrac{2(\omega^2 L1^2 + R1^2)R2}{\omega^2 M^2} + 2R1 \right) & \left( \dfrac{2(\omega^2 L1^2 + R1^2)L2}{\omega M^2} - 2\omega L1 \right) & \left( \begin{array}{c} \dfrac{(\omega^2 L1^2 + R1^2)R2^2}{\omega^2 M^2} + \\ \dfrac{(\omega^2 L1^2 + R1^2)L2^2}{M^2} - \\ 2\omega^2 L1 L2 + 2R1R2 + \omega^2 M^2 \end{array} \right) \\ (1) & (0) & (0) & (0) \\ \left( \dfrac{M3^2}{M^2} \right) & \left( \dfrac{2M3^2 R2}{M^2} \right) & \left( \dfrac{2\omega M3^2 L2}{M^2} - \dfrac{2\omega M3M4}{M} \right) & \left( \begin{array}{c} \dfrac{M3^2 R2^2}{M^2} + \dfrac{\omega^2 M3^2 L2^2}{M^2} - \\ \dfrac{2\omega^2 M3M4 L2}{M} + \omega^2 M4^2 \end{array} \right) \\ \left( \dfrac{M5^2}{M^2} \right) & \left( \dfrac{2M5^2 R2}{M^2} \right) & \left( \dfrac{2\omega M5^2 L2}{M^2} - \dfrac{2\omega M5M6}{M} \right) & \left( \begin{array}{c} \dfrac{M5^2 R2^2}{M^2} + \dfrac{\omega^2 M5^2 L2^2}{M^2} - \\ \dfrac{2\omega^2 M5M6 L2}{M} + \omega^2 M6^2 \end{array} \right) \\ \left( \dfrac{M7^2}{M^2} \right) & \left( \dfrac{2M7^2 R2}{M^2} \right) & \left( \dfrac{2\omega M7^2 L2}{M^2} - \dfrac{2\omega M7M8}{M} \right) & \left( \begin{array}{c} \dfrac{M7^2 R2^2}{M^2} + \dfrac{\omega^2 M7^2 L2^2}{M^2} - \\ \dfrac{2\omega^2 M7M8 L2}{M} + \omega^2 M8^2 \end{array} \right) \end{bmatrix} \times$$

$$\begin{bmatrix} |I2|^2 (\text{real}(ZL)^2 + \text{imag}(ZL)^2) \\ |I2|^2 \text{real}(ZL) \\ |I2|^2 \text{imag}(ZL) \\ |I2|^2 \end{bmatrix}$$

where L1 is an inductance of primary coil 512, L2 is an inductance of secondary coil 514, M is a mutual inductance between primary coil 512 and secondary coil 514, R1 is a resistance of primary coil 512, R2 is a resistance of secondary coil 514, M3 is a mutual inductance between sense inductor 534 and primary coil 512, M4 is a mutual inductance between sense inductor 534 and secondary coil 514, M5 is a mutual inductance between sense inductor 538 and primary coil 512, M6 is a mutual inductance between sense inductor 538 and secondary coil 514, M7 is a mutual inductance between sense inductor 542 and primary coil 512, M8 is a mutual inductance between sense inductor 542 and secondary coil 514, imag(ZL) corresponds to an imaginary part of the complex load impedance of antenna 510 and real(ZL) corresponds to a real part of the complex load impedance of antenna 510.

For simplicity, the left matrix of Equation 31 may be represented by a variable A, thereby yielding Equation 32, which is shown below:

$$\begin{bmatrix} |V1|^2 \\ |V2|^2 \\ |V3|^2 \\ |V4|^2 \\ |V5|^2 \end{bmatrix} = A \begin{bmatrix} |I2|^2 (\text{real}(ZL)^2 - \text{imag}(ZL)^2) \\ |I2|^2 \text{real}(ZL)^2 \\ \text{imag}(ZL) \\ |I2|^2 \end{bmatrix} \quad \text{(Equation 32)}$$

$|I2|^2$ and real(ZL) may be solved for using the linear system shown in Equation 32. In accordance with an embodiment, $|I2|^2$ and real(ZL) are solved for by obtaining the ordinary least squares solution of the linear system of Equation 32.

Once $|I2|^2$ and real(ZL) are determined, the true power provided by power amplifier 506 may be determined in accordance with Equation 1, as described above.

Accordingly, in embodiments, the above-described power detectors may operate in various ways to determine a true power provided by a power amplifier of an RF transmitter.

Figure 6:
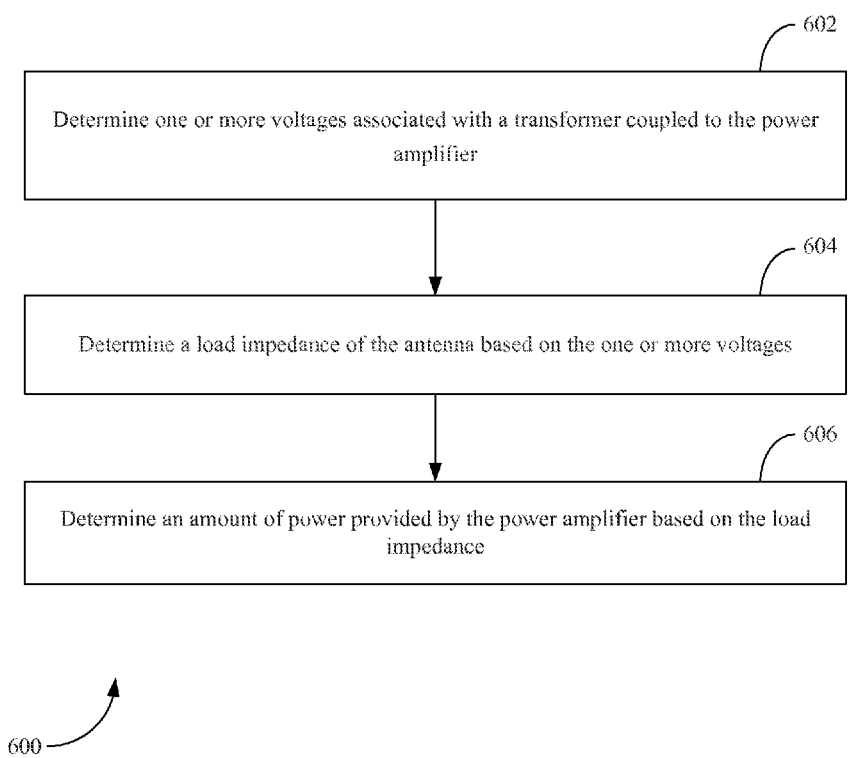
FIG. 6 is a flowchart providing example steps for determining a true power provided by a power amplifier of a radio frequency (RF) transmitter in accordance with an embodiment.

For example, FIG. 6 shows a flowchart 600 providing example steps for determining a true power provided by a power amplifier of an RF transmitter, where the power amplifier provides an RF signal to an antenna of the RF transmitter for transmission thereby, in accordance with an embodiment. Power detector 104 of FIG. 1, power detector 204 of FIG. 2, power detector 304 of FIG. 3, power detector 404 of FIG. 4 and power detector 504 of FIG. 5 may each operate according to flowchart 600. The method of flowchart 600 will now be described with continued reference to power detector 302 of FIG. 3, although the method is not limited to that implementation. Other structural and operational embodiments will be apparent to persons skilled in the relevant art(s) based on the discussion regarding flowchart 600 and power detector 302. Flowchart 600 is described as follows.

As shown in FIG. 6, one or more voltages associated with a transformer coupled to the power amplifier is determined (602). For example, with reference to FIG. 3, first voltage detector 322, second voltage detector 324 and sense inductor-based voltage detector 320 determine voltages associated with transformer 308. As was previously explained, transformer 308 converts the differential RF output signals to a single-ended RF signal and provides the single-ended RF signal to antenna 310 for transmission.

In accordance with one or more embodiments, the voltage(s) include an input voltage of the transformer, an output voltage of the transformer that comprises a primary coil and the secondary coil, and at least one voltage across at least one sense inductor coupled to the primary coil and the secondary coil. For example, with reference to FIG. 3, one of the voltage(s) may be the input voltage of transformer 308, another one of the voltage(s) may be the output voltage of transformer 308 and yet another one of the voltage(s) may be the voltage across sense inductor 334.

Continuing with flowchart 600, a load impedance of the antenna is determined based on the voltage(s) (604). For example, with reference to FIG. 3, power determination logic 316 determines the load impedance of antenna 310 based on the voltage(s) provided by first voltage detector 322, second voltage detector 324 and sense inductor-based voltage detector 320.

In accordance with one or more embodiments, the load impedance is determined based on the voltage(s) and characteristic(s) of the primary coil, the secondary coil, and the at least one sense inductor. For example, with reference to FIG. 3, power determination logic 316 determines the load impedance based on the voltage(s) provided by first voltage detector 322, second voltage detector 324 and sense inductor-based voltage detector 320 and characteristic(s) of at least one of primary coil 312, secondary coil 314 and sense inductor 334.

In accordance with one or more embodiments, the characteristic(s) comprise at least one of a first mutual inductance between the primary coil and the secondary coil, a second mutual inductance between the at least one sense inductor and the primary coil and a third mutual inductance between the at least one sense inductor and the secondary coil. For example, with reference to FIG. 3, the characteristic(s) comprise at least one of a first mutual inductance between primary coil 312 and secondary coil 314, a second mutual inductance between the sense inductor 334 and primary coil 312 and a third mutual inductance between the sense inductor 334 and secondary coil 314.

In accordance with one or more embodiments, power determination logic 316 determines the load impedance in accordance with Equation 16, as described above.

Continuing with flowchart 600, an amount of power provided by the power amplifier is determined based on the load impedance (606). For example, with reference to FIG. 3, power determination logic 316 determines the amount of power provided by power amplifier 306 based on the load impedance of antenna 310.

In accordance with one or more embodiments, power determination logic 316 determines the amount of power in accordance with Equation 1, as described above in subsection A.

III. Example Processor Implementation

Figure 7:
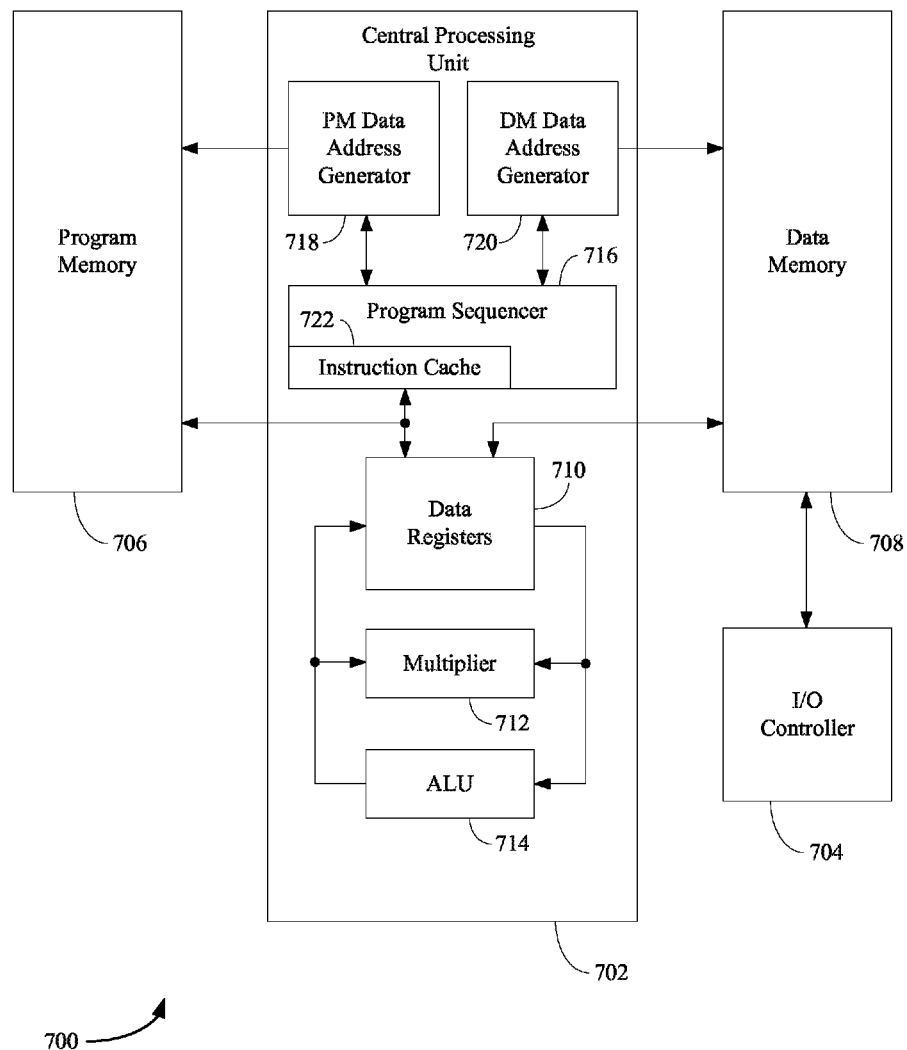
FIG. 7 is a block diagram of a processor that may be configured to perform techniques disclosed herein.

FIG. 7 depicts a block diagram of a processor circuit 700 in which portions of electronic device 100, RF transmitter 202 and/or power detector 204 (and the components and/or sub-components described therein), as shown in FIG. 2, RF transmitter 302 and/or power detector 304 (and the components and/or sub-components described therein), as shown in FIG. 3, RF transmitter 402 and/or power detector 404 (and the components and/or sub-components described therein), as shown in FIG. 4, RF transmitter 502 and/or power detector 504 (and the components and/or sub-components described therein), as shown in FIG. 5, flowchart 600, as shown in FIG. 6, as well as any methods, algorithms, and functions described herein, may be implemented. For example, each of power determination logic 216, power determination logic 316, power determination logic 416, and/or power determination logic 516 may be implemented through the execution of program instructions by processor circuit 700.

Processor circuit 700 includes a central processing unit (CPU) 702, an I/O controller 704, a program memory 706, and a data memory 708. CPU 702 may be configured to perform a main computation and data processing function of processor circuit 700. I/O controller 704 may be configured to control communication with external devices via one or more serial ports and/or one or more link ports. For example, I/O controller 704 may be configured to provide data read from data memory 708 to one or more external devices and/or store data received from external device(s) into data memory 708. Program memory 706 may be configured to store program instructions used to process data. Data memory 708 may be configured to store data to be processed.

Processor circuit 700 further includes one or more data registers 710, a multiplier 712, and/or an arithmetic logic unit (ALU) 714. Data register(s) 710 may be configured to store data for intermediate calculations, prepare data to be processed by CPU 702, serve as a buffer for data transfer, hold flags for program control, etc. Multiplier 712 may be configured to receive data stored in data register(s) 710, multiply the data, and store the result into data register(s) 710 and/or data memory 708. ALU 714 may be configured to perform addition, subtraction, absolute value operations, logical operations (AND, OR, XOR, NOT, etc.), shifting operations, conversion between fixed and floating point formats, and/or the like.

CPU 702 further includes a program sequencer 716, a program memory (PM) data address generator 718 and a data memory (DM) data address generator 720. Program sequencer 716 may be configured to manage program structure and program flow by generating an address of an instruction to be fetched from program memory 706. Program sequencer 716 may also be configured to fetch instruction(s) from an instruction cache 722, which may store an N number of recently-executed instructions, where N is a positive integer. PM data address generator 718 may be configured to supply one or more addresses to program memory 706, which specify where instructions are to be read from or written to in program memory 706. DM data address generator 720 may configured to supply address(es) to data memory 708, which specify where data is to be read from or written to in data memory 708.

IV. Further Example Embodiments

Techniques, including methods, and embodiments described herein may be implemented by hardware (digital and/or analog) or a combination of hardware with one or both of software and/or firmware. Techniques described herein may be implemented by one or more components. Embodiments may comprise computer program products comprising logic (e.g., in the form of program code or software as well as firmware) stored on any computer useable medium, which may be integrated in or separate from other components. Such program code, when executed by one or more processor circuits, causes a device to operate as described herein. Devices in which embodiments may be implemented may include storage, such as storage drives, memory devices, and further types of physical hardware computer-readable storage media. Examples of such computer-readable storage media include, a hard disk, a removable magnetic disk, a removable optical disk, flash memory cards, digital video disks, random access memories (RAMs), read only memories (ROM), and other types of physical hardware storage media. In greater detail, examples of such computer-readable storage media include, but are not limited to, a hard disk associated with a hard disk drive, a removable magnetic disk, a removable optical disk (e.g., CDROMs, DVDs, etc.), zip disks, tapes, magnetic storage devices, MEMS (micro-electromechanical systems) storage, nanotechnology-based storage devices, flash memory cards, digital video discs, RAM devices, ROM devices, and further types of physical hardware storage media. Such computer-readable storage media may, for example, store computer program logic, e.g., program modules, comprising computer executable instructions that, when executed by one or more processor circuits, provide and/or maintain one or more aspects of functionality described herein with reference to the figures, as well as any and all components, steps and functions therein and/or further embodiments described herein.

Such computer-readable storage media are distinguished from and non-overlapping with communication media (do not include communication media). Communication media embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wireless media such as acoustic, RF, infrared and other wireless media, as well as signals transmitted over wires. Embodiments are also directed to such communication media.

The techniques and embodiments described herein may be implemented as, or in, various types of devices. For instance, embodiments may be included in mobile devices such as laptop computers, handheld devices such as mobile phones (e.g., cellular and smart phones), handheld computers, and further types of mobile devices, stationary devices such as conference phones, office phones, gaming consoles, and desktop computers, as well as car entertainment/navigation systems. A device, as defined herein, is a machine or manufacture as defined by 35 U.S.C. §101. Devices may include digital circuits, analog circuits, or a combination thereof. Devices may include one or more processor circuits (e.g., processor circuit 700 of FIG. 7, central processing units (CPUs), microprocessors, digital signal processors (DSPs), and further types of physical hardware processor circuits) and/or may be implemented with any semiconductor technology in a semiconductor material, including one or more of a Bipolar Junction Transistor (BJT), a heterojunction bipolar transistor (HBT), a metal oxide field effect transistor (MOSFET) device, a metal semiconductor field effect transistor (MESFET) or other transconductor or transistor technology device. Such devices may use the same or alternative configurations other than the configuration illustrated in embodiments presented herein.

V. Conclusion

While various embodiments have been described above, it should be understood that they have been presented by way of example only, and not limitation. It will be apparent to persons skilled in the relevant art that various changes in form and detail can be made therein without departing from the spirit and scope of the embodiments. Thus, the breadth and scope of the embodiments should not be limited by any of the above-described exemplary embodiments, but should be defined only in accordance with the following claims and their equivalents.

What is claimed is:

1. A power detector, comprising:
   a first voltage detector coupled to an input of a transformer that is coupled between a power amplifier and an antenna of a radio frequency (RF) transmitter and configured to determine a first voltage associated with the input of the transformer;
   a second voltage detector coupled to an output of the transformer, the second voltage detector being configured to determine a second voltage associated with the output of the transformer;
   a sense inductor-based voltage detector coupled to the transformer and configured to determine a third voltage associated with the transformer; and
   power determination logic that is configured to determine an amount of power provided by the power amplifier based on the first voltage, the second voltage, and the third voltage.

2. The power detector of claim 1, wherein the transformer comprises a primary coil coupled to one or more outputs of the power amplifier and a secondary coil coupled to the antenna.

3. The power detector of claim 2, wherein the sense inductor-based voltage detector is coupled to a sense inductor, wherein the sense inductor is coupled to the primary coil and the secondary coil, and wherein the third voltage is a voltage across the sense inductor.

4. The power detector of claim 2, wherein the power determination logic is configured to determine a load impedance of the antenna based at least on the first voltage, the second voltage, and the third voltage, and to determine the amount of power provided by the power amplifier based on the load impedance of the antenna.

5. The power detector of claim 4, wherein the power determination logic is configured to determine the load impedance of the antenna based at least on the first voltage, the second voltage, the third voltage and one or more characteristics of the primary coil, the secondary coil and the sense inductor.

6. The power detector of claim 5, wherein the one or more characteristics of the primary coil, the secondary coil and the sense inductor comprise at least one of:
   a first mutual inductance between the primary coil and the secondary coil:
   a second mutual inductance between the sense inductor and the primary coil; and
   a third mutual inductance between the sense inductor and the secondary coil.

7. The power detector of claim 1, wherein the first voltage is an input voltage of the transformer.

8. The power detector of claim 1, wherein the second voltage is an output voltage of the transformer.

9. A method for determining an amount of power provided by a power amplifier of a radio frequency (RF) transmitter, the power amplifier providing an RF signal to an antenna of the RF transmitter for transmission thereby, the method comprising:
   determining an input voltage and an output voltage associated with a transformer coupled to the power amplifier, the transformer comprising a primary coil and a secondary coil;
   determining at least one voltage across at least one sense inductor coupled to the primary coil and the secondary coil;
   determining a load impedance of the antenna based on the input voltage, the output voltage, and the at least one voltage across the at least one sense inductor; and
   determining the amount of power provided by the power amplifier based on the load impedance of the antenna.

10. The method of claim 9, wherein the determining the load impedance of the antenna based on the input voltage, the output voltage, and the at least one voltage across the at least one sense inductor comprises:
    determining the load impedance of the antenna based on the input voltage, the output voltage, the at least one voltage across the at least one sense inductor and one or more characteristics of the primary coil, the secondary coil, and the at least one sense inductor.

11. The method of claim 10, wherein the one or more characteristics of the primary coil, the secondary coil and the at least one sense inductor comprise at least one of:
    a first mutual inductance between the primary coil and the secondary coil:
    a second mutual inductance between the at least one sense inductor and the primary coil; and
    a third mutual inductance between the at least one sense inductor and the secondary coil.

12. The method of claim 9, wherein the secondary coil is coupled to the antenna.

13. A power detector, comprising:
    a first voltage detector coupled to an input of a transformer coupled between a power amplifier and an antenna of a radio frequency (RF) transmitter and configured to determine a first voltage associated with the input of the transformer;
    a second voltage detector coupled to an output of the transformer and configured to determine a second voltage associated with the output of the transformer;
    a plurality of sense inductor-based voltage detectors coupled to the transformer and configured to determine a plurality of third voltages associated with the transformer; and
    power determination logic that is configured to determine an amount of power provided by the power amplifier based on the first voltage, the second voltage, and the plurality of third voltages.

14. The power detector of claim 13, wherein the first voltage is an input voltage of the transformer.

15. The power detector of claim 13, wherein the transformer comprises a primary coil coupled to one or more outputs of the power amplifier and a secondary coil coupled to the antenna.

16. The power detector of claim 15, wherein each of the plurality of sense inductor-based voltage detectors are coupled to respective sense inductors, wherein the respective sense inductors are coupled to the primary coil and the secondary coil, and wherein the plurality of third voltages are respective voltages across the respective sense inductors.

17. The power detector of claim 16, wherein the power determination logic is configured to determine a load impedance of the antenna based at least on the first voltage, the second voltage, and the plurality of third voltages, and to determine the amount of power provided by the power amplifier based on the load impedance of the antenna.

18. The power detector of claim 17, wherein the power determination logic is configured to determine the load impedance of the antenna based at least on the first voltage, the second voltage, the plurality of third voltages, and one or more characteristics of the primary coil, the secondary coil and the respective sense inductors.

19. The power detector of claim 18, wherein the one or more characteristics of the primary coil, the secondary coil and the respective sense inductors comprise at least one of:
    a first mutual inductance between the primary coil and the secondary coil:
    a second mutual inductance between each of the respective sense inductors and the primary coil; and
    a respective third mutual inductance between each of the respective sense inductors and the secondary coil.

20. The power detector of claim 13, wherein the second voltage is an output voltage of the transformer.

* * * * *